(12) United States Patent
Majumder

(10) Patent No.: US 10,110,209 B1
(45) Date of Patent: *Oct. 23, 2018

(54) PROCESS COMPENSATED DELAY

(71) Applicant: Integrated Device Technology, Inc., San Jose, CA (US)

(72) Inventor: Amit Majumder, Johns Creek, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 88 days.

This patent is subject to a terminal disclaimer.

(21) Appl. No.: 14/675,369

(22) Filed: Mar. 31, 2015

Related U.S. Application Data

(63) Continuation of application No. 14/190,890, filed on Feb. 26, 2014, now Pat. No. 9,264,027.

(60) Provisional application No. 61/784,152, filed on Mar. 14, 2013.

(51) Int. Cl.
  *H03K 5/14* (2014.01)
  *G05F 3/16* (2006.01)
  *H01G 7/00* (2006.01)

(52) U.S. Cl.
  CPC ............... *H03K 5/14* (2013.01); *H01G 7/00* (2013.01)

(58) Field of Classification Search
  USPC ............... 327/278, 281, 262–264, 530–541, 327/512–513
  See application file for complete search history.

(56) References Cited

U.S. PATENT DOCUMENTS

| | | | | |
|---|---|---|---|---|
| 4,981,807 A * | 1/1991 | Jambotkar | ......... | H01L 27/0605 148/DIG. 109 |
| 5,130,564 A | 7/1992 | Sin | | |
| 5,694,070 A * | 12/1997 | Black | ..................... | H03K 5/133 327/264 |
| 6,060,930 A | 5/2000 | Choi | | |
| 6,111,440 A | 8/2000 | Rajagopalan et al. | | |
| 6,404,260 B1 | 6/2002 | Cruz-Albrecht | | |
| 6,972,530 B1 | 12/2005 | Xin-LeBlanc | | |
| 7,378,901 B2 * | 5/2008 | Chung | ............... | H01L 27/0808 257/E27.016 |
| 7,554,405 B2 * | 6/2009 | Kim | ..................... | H03F 3/3022 330/257 |
| 7,619,457 B1 * | 11/2009 | Mai | ..................... | H03H 11/265 327/264 |
| 8,350,608 B2 * | 1/2013 | Lee | ......................... | H03L 7/083 327/156 |
| 9,559,578 B2 * | 1/2017 | Schrom | ..................... | G06F 1/26 |
| 9,678,481 B1 * | 6/2017 | Gao | ..................... | G04F 10/005 |
| 2002/0024094 A1 * | 2/2002 | Gao | ..................... | H01L 21/8258 257/347 |
| 2010/0095259 A1 * | 4/2010 | Tetelbaum | ......... | G06F 17/5031 716/113 |

(Continued)

OTHER PUBLICATIONS

Rasoul Dehghani and S. M. Atarodi, A New Low Voltage Precision CMOS Current Reference With No External Components, p. 928, IEEE Transactions on Circuits and Systems—II : Analog and Digital Signal Processing, vol . 50, No . 12, Dec. 2003.

*Primary Examiner* — An Luu
(74) *Attorney, Agent, or Firm* — Heimlich Law, PC; Alan Heimlich, Esq.

(57) ABSTRACT

A Process Compensated Delay has been disclosed. In one implementation delay is primarily based on electron mobility.

3 Claims, 3 Drawing Sheets

(56) References Cited

U.S. PATENT DOCUMENTS

2013/0009622 A1   1/2013   Hu et al.

* cited by examiner

PROCESS COMPENSATED DELAY

RELATED APPLICATION

The present Application for Patent claims priority to U.S. patent application Ser. No. 14/190,890 titled "Process Compensated Delay" filed Feb. 26, 2014, pending, and which is hereby incorporated herein by reference. The present Application for Patent claims priority to U.S. Patent Application No. 61/784,152 titled "Process Compensated Delay" filed Mar. 14, 2013, and which is hereby incorporated herein by reference.

FIELD OF THE INVENTION

The present invention pertains to delays (e.g. time delays). More particularly, the present invention relates to a Process Compensated Delay.

BACKGROUND OF THE INVENTION

Delay elements and the accurate delaying of signals (in time) is critical to high speed performance. Process variations in ICs (integrated circuits) fabrication affect the delay element and cause variation in the delay of fabricated elements. This presents a technical problem for which a technical solution using a technical means is needed.

BRIEF DESCRIPTION OF THE DRAWINGS

The invention is illustrated by way of example and not limitation in the figures of the accompanying drawings.

DETAILED DESCRIPTION

Figure 1:
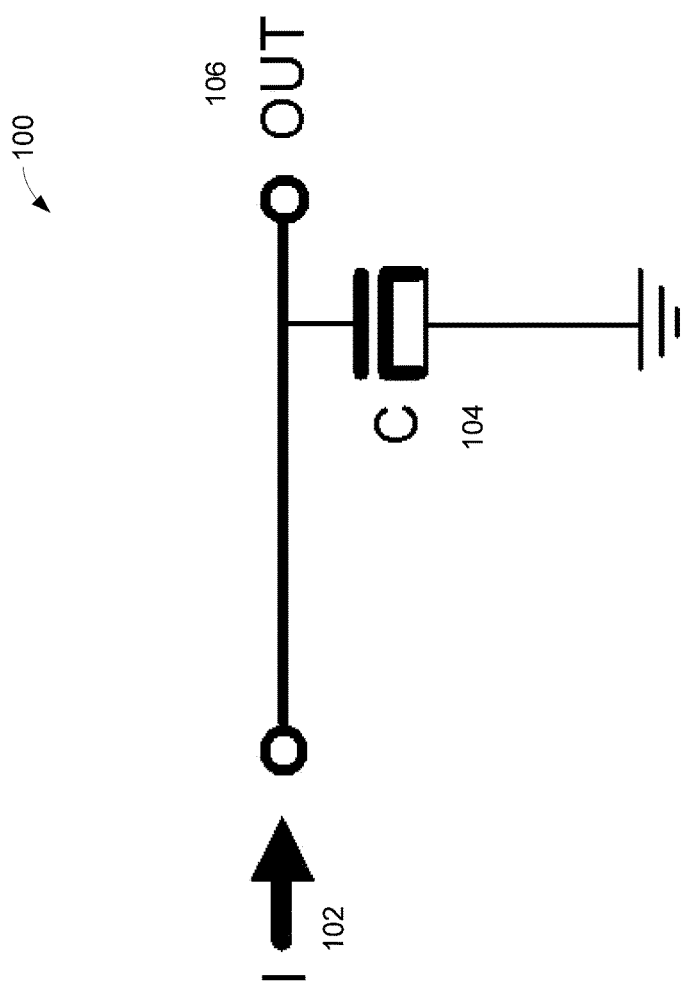
FIG. 1 shows one embodiment of the invention showing a Process Compensated Delay Block Diagram.

In one embodiment of the invention, a new and novel approach to implement on-die (e.g. integrated circuit (IC)) constant delay is disclosed. The new approach involves pumping a current into a capacitor and implementing a delay as the capacitor voltage rises from zero to a reference voltage. In one embodiment of the invention, with a temperature-independent current proportional to $\mu n/Tox$ ($\mu n$ is electron mobility and Tox is oxide thickness), with a capacitor proportional to 1/Tox, and with a PVT-independent (process, voltage, temperature) reference voltage, a delay is obtained that is only dependent on $\mu n$, which has a low dependency on process variations. Fine on-die delay control is achievable with this approach. Thus a dramatic and unexpected (accurate delay and fine control) result was achieved.

In one embodiment of the invention, for example as used in DDR3/DDR4 Memory System's Memory Buffer, Register and/or Data Buffer designs, implementation of on-die constant delay with tight spread is achieved in order to meet very stringent chip propagation delay specifications.

In one embodiment of the invention, the current is implemented as temperature-independent but proportional to $\mu n/Tox$ ($\mu n$ is electron mobility and Tox is oxide thickness). In one embodiment of the invention, a capacitor C is implemented using a thick-oxide nMOS (n-channel metal oxide semiconductor) varactor. The usage of a varactor eliminates threshold related effects for C. Usage of thick-oxide eliminates any gate leakage concerns. The capacitance varies inversely with gate oxide thickness, Tox. The combined effect is that the voltage of an output node (OUT) is dependent upon only $\mu n$, which has a low dependency on process variations.

In one embodiment of the invention, a bandgap reference has a positive temperature coefficient. The quasi CMOS (complementary metal oxide semiconductor) beta multiplier has a negative temperature coefficient. The combined effect is current (Iout) that is dependent upon only electron mobility, $\mu n$, which has a low dependency on process variations.

In one embodiment of the invention, a circuit using the techniques described was implemented using a process that contained a bandgap with a positive temperature coefficient. The capacitor was implemented via a thick-oxide nMOS varactor. The thick-oxide varies by over ±7% across process in reality, however using this disclosed novel approach, a temperature-independent delay is obtained that is dependent on only electron mobility, $\mu n$, which has a low dependency on process variations.

In one embodiment of the invention, a simulated delay has [−2.26, 3.29]% delay variation across PVT (Process, Voltage, Temperature).

In one embodiment of the invention, a pMOS (p-channel MOS) varactor may be used for the capacitor.

In one embodiment of the invention, an nMOS (n-channel MOS) varactor may be used for the capacitor.

In one embodiment of the invention, a regular pMOS and/or nMOS device may be used for the capacitor.

FIG. 1 shows, generally at 100, one embodiment of the invention showing a Process Compensated Delay Block Diagram.

FIG. 1 shows block diagram of process-compensated delay. The current is implemented as temperature-independent but proportional to $\mu_n/T_{ox}$ ($\mu_n$ is electron mobility and $T_{ox}$ is oxide thickness). Capacitor C 104 is implemented using a thick-oxide nMOS varactor. The usage of a varactor eliminates threshold related effects for C 104. Usage of thick-oxide eliminates any gate leakage concerns. The capacitance varies inversely with gate oxide thickness, $T_{ox}$. The combined effect is that the voltage of node OUT 106 is dependent upon only $\mu_n$, which has a low dependency on process variations.

Figure 2:
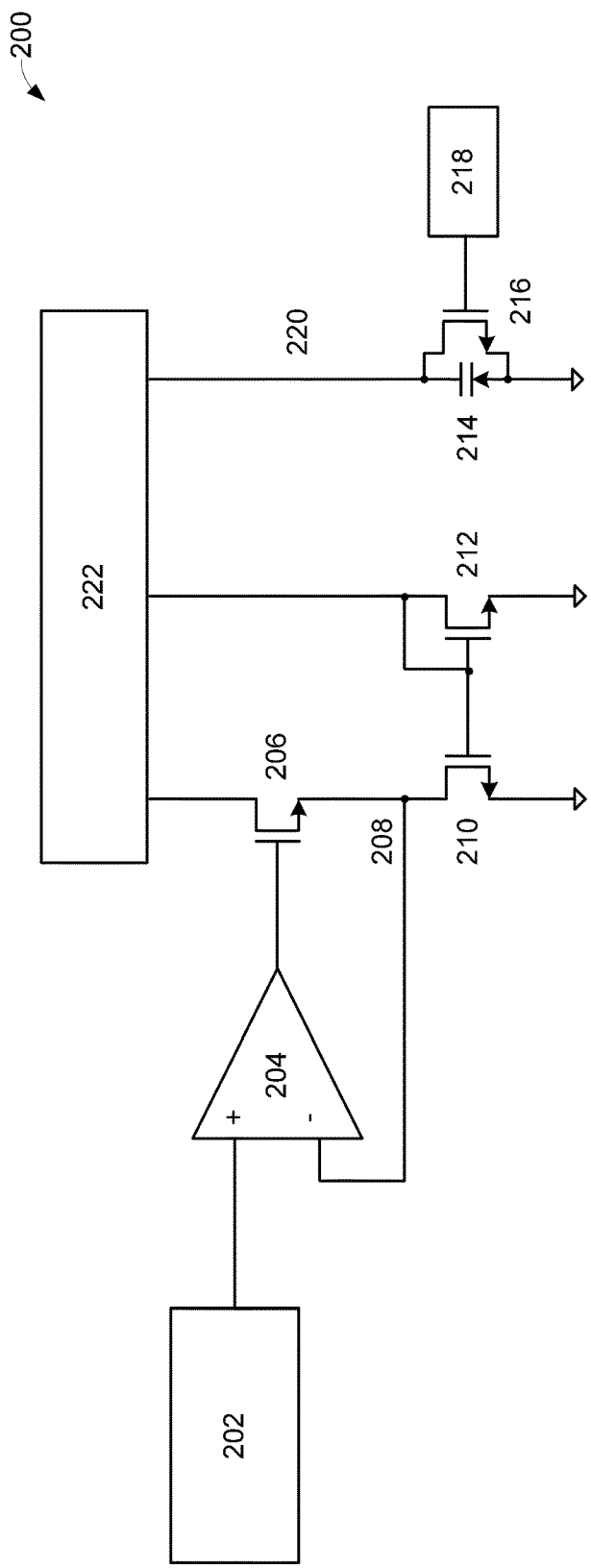
FIG. 2 shows one embodiment of the invention showing a current reference architecture.

FIG. 2 shows, generally at 200, one embodiment of the invention showing a current reference architecture. At 202 is a bandgap reference having a positive temperature coefficient. The quasi CMOS beta multiplier has a negative temperature coefficient. The combined effect is current Iout 220 which is the same as current going through transistor 210 and transistor 212 because of current mirror 222 is dependent upon only electron mobility, $\mu_n$, which has a low dependency on process variations. Operational amplifier 204 takes as input the bandgap reference 202 voltage and applies it to transistor 206 The voltage at the source of transistor 206 at node 208 is into the positive input of operational amplifier 204. Varactor 214 is shunted by transistor 216 which is controlled by an enabling block 218.

Figure 3:
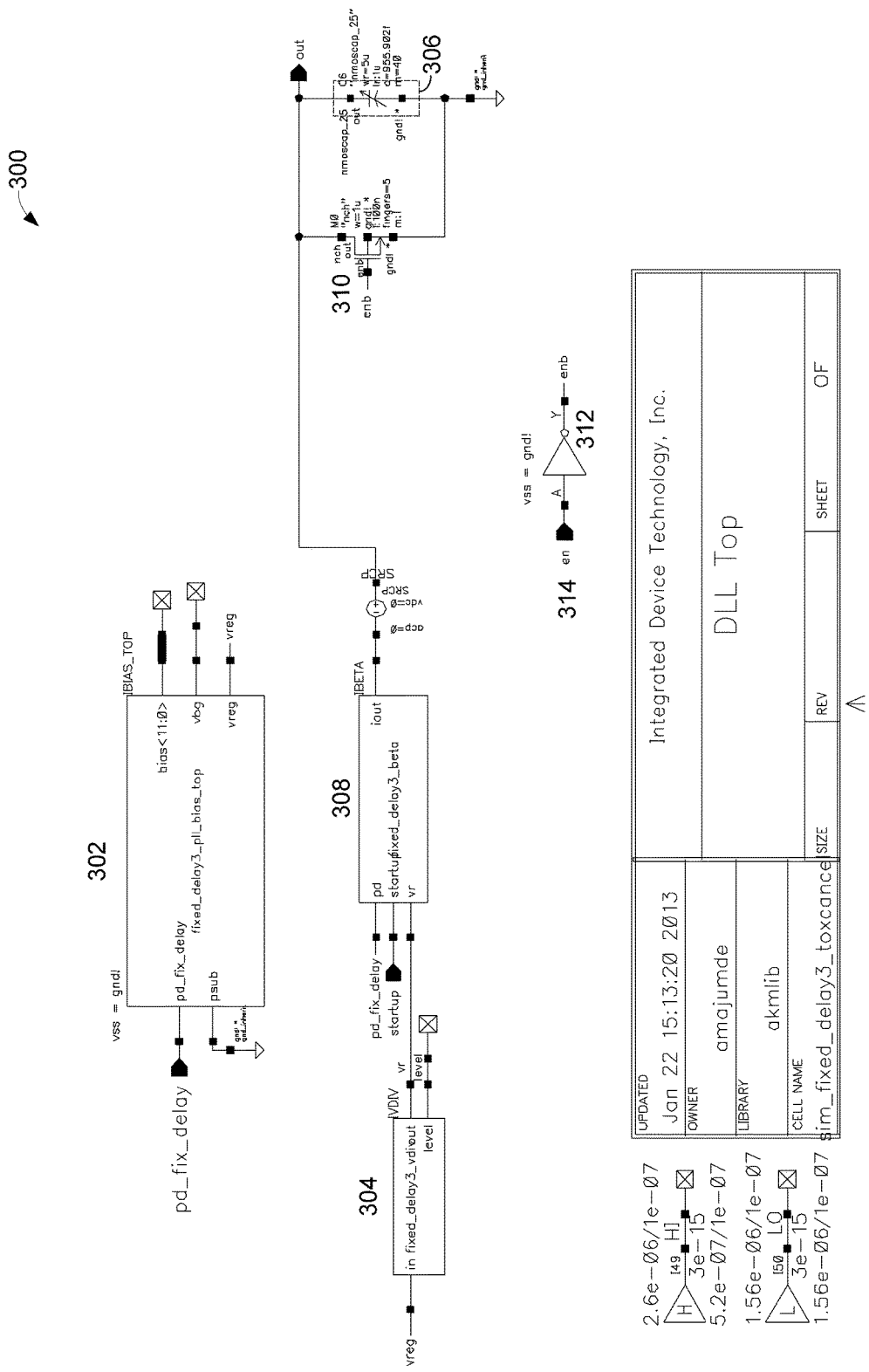
FIG. 3 shows various embodiments of the invention.

FIG. 3 shows, generally at 300, various embodiments of the invention.

The circuit was implemented using a given process G (FIG. 3). The topmost block 302 is the bandgap reference with a positive temperature coefficient. The leftmost block in the middle 304 scales down the bandgap reference voltage output before applying that voltage to the drain of a nMOS device, for example, such as that shown in FIG. 2 at 210. This ensure that nMOS device operates in the triode region. The rightmost device 306 is the capacitor implemented via thick-oxide nMOS varactor. Thick-oxide should not vary over ±5% as per the process G documentation, but it actually varies by over ±7% across process in reality. Block 308 represents a current mirror, 310 a shunt transistor driven by inverted 312 controlled by an enable 314.

A nMOS device such as that shown in FIG. 2 at 206 is referred to as a transistor. One of skill in the art will appreciate that a complimentary device, that is a pMOS device is also referred to as a transistor.

Using this novel disclosed approach, a temperature-independent delay is obtained that is dependent on only electron mobility, $\mu_n$, which has a low dependency on process variations. The simulated delay has [−2.26, 3.29]% delay variation across PVT (Process, Voltage, Temperature).

Thus a Process Compensated Delay has been described.

Because of the high accuracy and noise considerations in embodiments of the present invention (for example, delay speed) specialized hardware is required.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

As used in this description, "primarily" or similar phrases are used to indicate that the item(s) discussed is a significant factor and is predominately more important or having greater influence than other factors.

As used in this description, "low dependency" or "low dependency on process variations" or similar phrases are used to indicate that the item(s) discussed is not significantly affected by the factor discussed.

It is to be understood that in any one or more embodiments of the invention where alternative approaches or techniques are discussed that any and all such combinations as may be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a Process Compensated Delay has been described.

What is claimed is:

1. An apparatus comprising a positive temperature coefficient bandgap reference coupled to a positive input of an operational amplifier, an output of said operational amplifier coupled to a first transistor gate, a source of said first transistor directly coupled to a negative input of said operational amplifier and a drain of a second transistor, a drain of said first transistor coupled to a current mirror, a thick oxide nMOS varactor coupled to said current mirror.

2. The apparatus of claim 1 wherein said second transistor operates in a triode region.

3. The apparatus of claim 2 wherein said second transistor has a negative temperature coefficient.

\* \* \* \* \*